United States Patent [19]

Stephanides

[11] Patent Number: 4,471,333
[45] Date of Patent: Sep. 11, 1984

[54] CURRENT TRANSFORMER WITH A RING-SHAPED CORE FOR USE IN A HIGH VOLTAGE SWITCHING DEVICE ENCLOSED IN A METALLIC CASING

[75] Inventor: Viktor H. Stephanides, Zürich, Switzerland

[73] Assignee: Sprecher & Schuh AG, Aarau, Switzerland

[21] Appl. No.: 350,917

[22] Filed: Feb. 22, 1982

[30] Foreign Application Priority Data

Apr. 28, 1981 [CH] Switzerland .................. 2754/81

[51] Int. Cl.³ ............................................ H01F 15/04
[52] U.S. Cl. ................................ 336/84 C; 336/84 R;
336/90; 336/73; 336/69; 336/211; 336/212
[58] Field of Search ................. 336/84 C, 84 R, 90, 336/73, 69, 211, 212

[56] References Cited

U.S. PATENT DOCUMENTS

| | | | |
|---|---|---|---|
| 3,173,115 | 3/1965 | Peuron | 336/84 C |
| 3,921,113 | 11/1975 | Schiemann | 336/84 R |
| 3,959,761 | 5/1976 | Graul | 336/84 R |
| 4,320,337 | 3/1982 | Hartmann et al. | 336/174 X |
| 4,354,154 | 10/1982 | Schiemann | 336/174 X |

Primary Examiner—J. V. Truhe
Assistant Examiner—Susan Steward
Attorney, Agent, or Firm—Ladas & Parry

[57] ABSTRACT

A current transformer having at least one ring-shaped core with a secondary winding mounted thereon, and a primary conductor, located within its casing. An inner tube is provided between the ring-shaped core and the primary conductor, one end of the tube being electrically connected to the casing and its other parts electrically insulated therefrom. A cylindrical, electrically conductive screening shield at least partially overlaps the inner tube and is electrically connected to the casing on the side of the ring-shaped core which is distal from the electrical connection between the casing and the inner tube, while the other parts of the shield are electrically insulated from the casing. This overlap forms a short-circuit loop for any steep progressing wave which is generated when switching on a potential-free part of the circuitry, or when due to an interruption, a small capacitive current breaks off. The short-circuit loop thus prevents the generation of high inductive voltages at the secondary leads of the current transformer. The overlap also enables a steep progressing wave to progress without reflection and without capacitively influencing the potential of the secondary winding.

5 Claims, 1 Drawing Figure

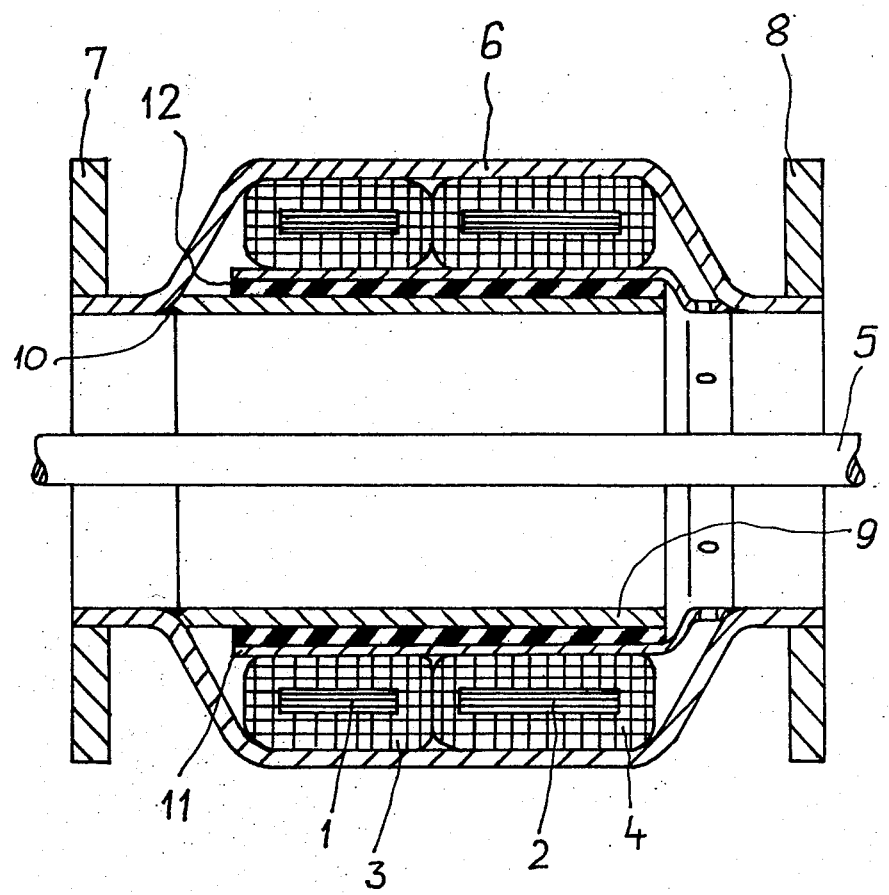

CURRENT TRANSFORMER WITH A RING-SHAPED CORE FOR USE IN A HIGH VOLTAGE SWITCHING DEVICE ENCLOSED IN A METALLIC CASING

FIELD OF THE INVENTION

This invention relates to current transformers having a ring-shaped core for use in a high voltage switching device enclosed in a metallic casing, within which there is at least one ring-shaped core and an associated secondary winding mounted around the core, where the transformer further has a primary conductor located within the opening of the core, and where there is provided between the core and the primary conductor an inner tube, one end of which is electrically connected with the casing, while its other parts are electrically insulated therefrom.

Current transformers with ring-shaped cores are known, for instance, from BBC Communication 54 (1967), Volume 12, Page 770, FIG. 2, or from Swiss Pat. No. 570 685. Voltages with very high peak values, exceeding approximately 1000 V, can occur at the secondary terminals of such current transformers, when a voltageless potential free circuit section representing a small capacitance is connected, or when in the course of an interrupt a small capacitive current is disrupted. In such instances, there arises a progressing wave which moves in both directions from the location of the arc which is switched on switched off, and which wave can exhibit rise times of about 2 to 300 ns. Because the inner tube has a free end, the progressing wave will on one hand move inside the inner conductor through the opening of the ring-shaped cores, and will on the other hand run around the ring-shaped cores, in the casing. The traveling wave, or surge, moving in the inner conductor induces a very high voltage in the windings of the transformer. With such a construction there is a capacitive coupling between the surge in the casing and the secondary winding of the current transformer. Therefore, the surge will increase the voltage of the secondary winding. Depending on the direction in which the surge progresses, there will also occur a reflection at the free end of the inner tube, because the length of the latter is approximately of the same order of magnitude as the frontal part of the surge. The reflected wave is capacitively coupled with the transformer windings and will also increase the voltage of the windings.

SUMMARY OF THE INVENTION

It is a general object of the present invention to provide a current transformer of the above-mentioned type, in which no dangerous overvoltages arise at the secondary terminals when potential free circuit sections representing a small capacitance are switched on, or when small capacitive currents are shut off during an interrupt.

In order to implement these and still further objects, the current transformer of the invention is characterized by an electrically conductive screening shield which has an end distal from the electrical connection between the casing and the inner tube, this distal end being electrically connected to the casing, while the other parts of the shield are insulated therefrom. The shield at least partially overlaps the inner tube in an electrically insulated fashion.

This arrangement insures that a steep surge induces practically no additional voltage at the secondary terminals of the current transformer. Indeed, the casing, the inner tube and the screening shield which overlaps the inner tube form a short-circuit loop for steep traveling waves at the ring-shaped core. This short-circuit loop prevents the formation of a high induced voltage at the secondary terminal of the current transformer. On the other hand, the overlap between the inner tube and the screening shield forms a longitudinal coupling for steep surges. With this arrangement, the progressing wave is led along the outer surface of the inner conductor and along the inner surface of the casing, the inner tube, and the screening shield, respectively. There is no capacitive coupling between the traveling wave and the secondary winding. There is also no reflection of the traveling wave at the inner tube, and this also reduces the overvoltage due to capacitive coupling.

For current transformers with ring-shaped cores which are located outside the casing, Swiss Patent 514 923 in fact already suggests that the casing, which passes through the opening of the ring-shaped cores, can be formed by casing tubes which partially overlap each other and are mutually electrically insulated through an intermediate insulating layer. In such a current transformer, the insulation located between the overlapping casing tubes must form a gastight enclosure for the switching device. The electrically insulating layer within the casing of this arrangement serves exclusively to suppress currents in the casing, which would disturb the measure. With this solution, the problem of very high overvoltages at the terminals of the current transformer, as mentioned above, does not arise, because an overvoltage as contemplated in connection with the present invention is prevented by the overlap of the casing tubes. It also follows, that from the solution just mentioned, the expert can deduce neither the problem solved by the present invention, nor its solution.

Advantageously, the screening shield will be located between the ring-shaped core and the inner tube, and be made out of a nonferromagnetic material.

BRIEF DESCRIPTION OF THE DRAWING

The single FIGURE illustrates a preferred embodiment of the invention, generally in cross section.

DETAILED DESCRIPTION OF A PREFERRED EMBODIMENT

The ring-shaped cores 1, 2 are provided with secondary windings 3, 4. The primary conductor 5 passes through the openings of the ring-shaped cores 1, 2. These ring-shaped cores 1, 2 are placed within the casing 6. The latter is provided with connecting flanges 7, 8, which permit its connection with further parts of the installation. At the location 10, the casing 6 is welded to the inner tube 9. This inner tube 9 reaches through the openings of the ring-shaped cores 1, 2, and is free at its other extremity. On the side of the ring-shaped cores 1, 2 distal from the electrical connection point 10 between tube and casing, the screening shield 11, which is made of stainless steel, is welded to the casing. This screening shield also reaches through the openings of the ring-shaped cores 1, 2, from the other side, and is also free at its other extremity. An electrically insulating layer 12 is placed between the inner tube 9 and the screening shield 11.

When there occurs a steep traveling wave, the casing 6, the inner tube 9, the shield 11 and the capacitance between the inner tube 9 and the shield 11 form a short-circuit loop for the ring-shaped cores 1 and 2, which loop prevents the generation of high induced voltages at the secondary terminals of the current transformer. The steep traveling wave can move practically without hindrance through the comparatively large capacitance formed by the overlap between the inner tube 9 and the shield 11, without being reflected, and will not capacitively increase the potential of the secondary windings 3, 4.

It is to be understood, that the invention is not limited to the presently shown and described preferred embodiment, but may be otherwise embodied and practiced within the scope of the following claims.

What is claimed is:

1. A current transformer for use in a high voltage switching device, the transformer comprising a metallic casing, within which the transformer has at least one ring-shaped core and a secondary winding around the core, the transformer having a primary conductor located within an opening of the casing, and an inner tube between said core and said primary conductor, one end of said tube being electrically connected directly to the casing, its other parts being electrically isolated from the casing, an electrically conductive screening shield having an end distal from the electrical connection between the casing and the inner tube, the distal end being electrically connected directly to the casing, insulation means for insulating the other parts of the shield from the tube, the shield at least partially overlapping the inner tube to define a region of overlap, said insulation means insulating said shield and the inner tube from one another in the region of overlap.

2. A current transformer according to claim 1, in which the screening shield is located between the ring core and the inner tube.

3. A current transformer according to claim 1 or 2, in which the screening shield is made of a nonferromagnetic material.

4. A current transformer according to claim 1, in which the region of overlap is in the shape of a hollow cylinder between the shield and the inner tube and in which an electrically insulating material fills substantially the entire region of overlap.

5. A current transformer according to claim 1, in which the casing, the inner tube and the shield form a closed conductive loop interrupted only by the region of overlap.

* * * * *